(12) United States Patent
Chiang

(10) Patent No.: US 12,119,839 B2
(45) Date of Patent: Oct. 15, 2024

(54) DIGITAL-TO-ANALOG CONVERTER

(71) Applicant: Winbond Electronics Corp., Taichung (TW)

(72) Inventor: Ju-An Chiang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 211 days.

(21) Appl. No.: 18/076,305

(22) Filed: Dec. 6, 2022

(65) Prior Publication Data

US 2024/0187018 A1    Jun. 6, 2024

(51) Int. Cl.
*H03M 1/66* (2006.01)
*H03M 1/68* (2006.01)
*H03M 1/72* (2006.01)
*H03M 1/74* (2006.01)
*H03M 1/80* (2006.01)

(52) U.S. Cl.
CPC ............ *H03M 1/808* (2013.01); *H03M 1/687* (2013.01); *H03M 1/72* (2013.01); *H03M 1/745* (2013.01)

(58) Field of Classification Search
CPC ........ H03M 1/808; H03M 1/687; H03M 1/72; H03M 1/80; H03M 1/745

USPC ................................................... 341/144, 153
See application file for complete search history.

(56) References Cited

U.S. PATENT DOCUMENTS

| | | | |
|---|---|---|---|
| 4,231,020 A * | 10/1980 | Azzis | H03M 1/687 341/135 |
| 7,688,240 B2 | 3/2010 | Jain et al. | |
| 10,726,927 B2 | 7/2020 | Murakami | |
| 2011/0086594 A1 * | 4/2011 | McElwee | H03F 3/193 330/253 |

* cited by examiner

*Primary Examiner* — Peguy Jean Pierre
(74) *Attorney, Agent, or Firm* — JCIPRNET

(57) ABSTRACT

A digital-to-analog converter includes an amplifier, a voltage relaxation circuit, a base current source, a first weighting current source, and at least one second weighting current source. The amplifier receives a reference voltage and a feedback voltage, and generates an output voltage according to the reference voltage and the feedback voltage. The base current source is coupled to an output end of the amplifier through the voltage relaxation circuit, and is configured to generate an adjustable base current. The first weighting current source generates an adjustable first weighting current between a reference ground end and one of a current load and the voltage relaxation circuit according to a first bit of input data. The second weighting current source generates at least one second weighting current according to at least one second bit of the input data.

15 Claims, 4 Drawing Sheets

DIGITAL-TO-ANALOG CONVERTER

BACKGROUND

Technical Field

The disclosure relates to a digital-to-analog converter, and particularly relates to a digital-to-analog converter capable of adjusting a voltage/current offset.

Description of Related Art

In the conventional art, a digital-to-analog conversion circuit operating in the current mode has a simpler structure, which also effectively saves the circuit area. However, it is inconvenient and not easy to perform on-chip trimming for the digital-to-analog conversion circuit.

The conventional art proposes a digital-to-analog conversion circuit that requires only a few microamperes in the actual operating range. However, the circuit elements of the high-voltage part required by this type of digital-to-analog conversion circuit need a charge pump circuit to provide a high voltage, resulting in waste of a large circuit area. Moreover, since the current actually operated is very small, the problem of a current/voltage offset may easily occur, which reduces the accuracy of digital-to-analog conversion.

SUMMARY

The disclosure provides a digital-to-analog converter that is capable of effectively adjusting a voltage/current offset.

A digital-to-analog converter according to an embodiment of the disclosure includes an amplifier, a voltage relaxation circuit, a base current source, a first weighting current source, and at least one second weighting current source. The amplifier receives a reference voltage and a feedback voltage, and generates an output voltage according to the reference voltage and the feedback voltage. The voltage relaxation circuit is coupled to an output end of the amplifier. The base current source is coupled to the output end of the amplifier through the voltage relaxation circuit and configured to generate a base current that is adjustable. The first weighting current source is coupled to the output end of the amplifier through a current load and the voltage relaxation circuit, and generates a first weighting current that is adjustable between the current load or the voltage relaxation circuit and a reference ground end according to a first bit of input data. The second weighting current source is coupled to the output end of the amplifier through the voltage relaxation circuit, and generates at least one second weighting current according to at least one second bit of the input data.

Based on the above, the digital-to-analog converter according to the disclosure adjusts the initial voltage output by the digital-to-analog converter to be equal to the target initial voltage through the adjustable base current provided by the base current source. Moreover, the digital-to-analog converter adjusts the weighting current provided by the weighting current source so as to adjust the slope of the curve of the output voltage of the digital-to-analog converter, thereby making the final voltage output by the digital-to-analog converter equal to the target final voltage. Thus, the digital-to-analog converter can effectively adjust the voltage/current offset and maintain the accuracy of digital-to-analog conversion.

DETAILED DESCRIPTION OF DISCLOSED EMBODIMENTS

Figure 1:
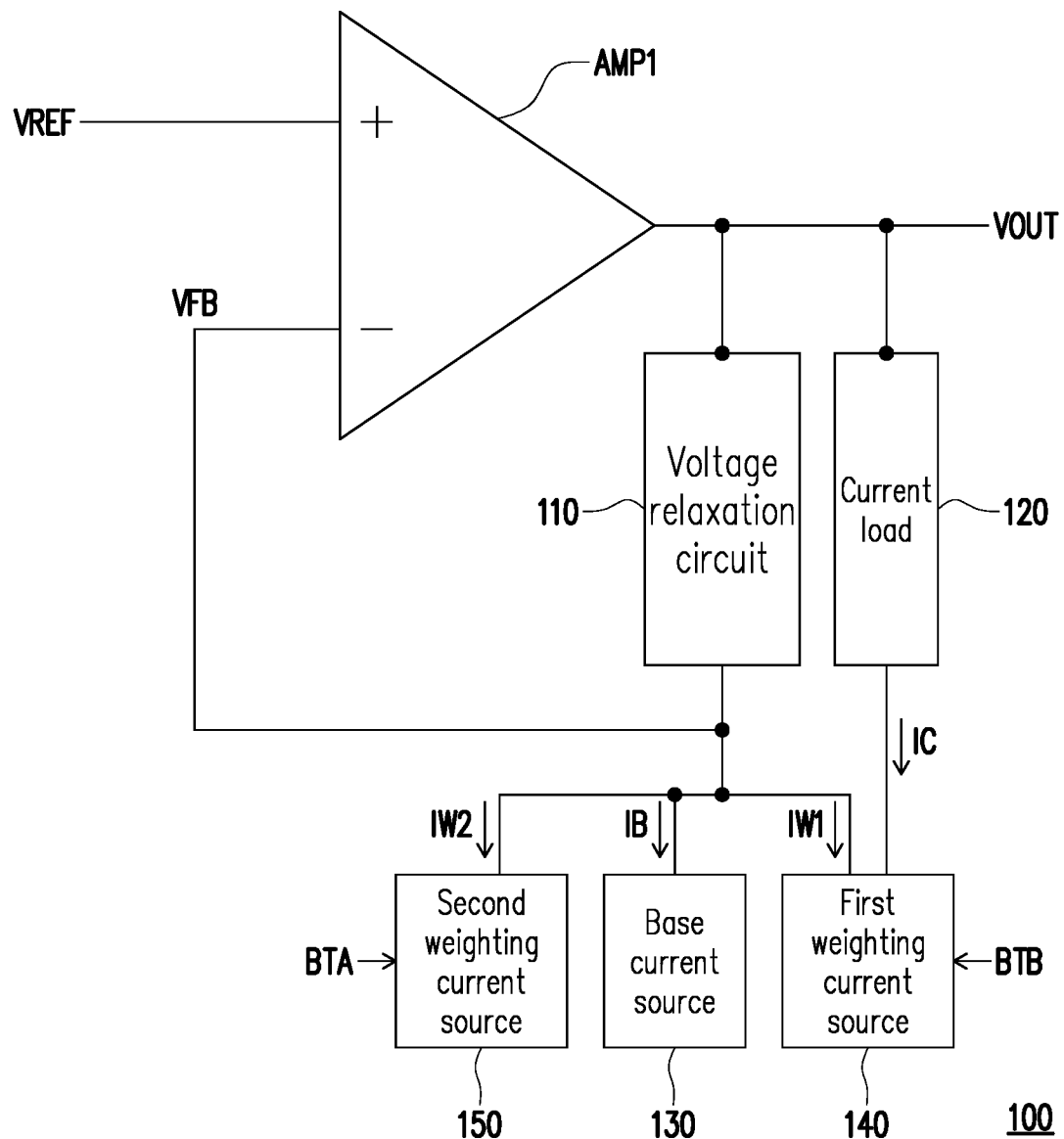
FIG. 1 is a schematic diagram of the digital-to-analog converter according to an embodiment of the disclosure.

Referring to FIG. 1, a digital-to-analog converter 100 includes an amplifier AMP1, a voltage relaxation circuit 110, a base current source 130, a first weighting current source 140, and one or more second weighting current sources 150. The amplifier AMP1 has a positive input end for receiving a reference voltage VREF and a negative input end for receiving a feedback voltage VFB. An output end of the amplifier AMP1 generates an output voltage VOUT.

In addition, a first end of the voltage relaxation circuit 110 is coupled to the output end of the amplifier AMP1, and a second end of the voltage relaxation circuit 110 can provide the feedback voltage VFB and is coupled to the base current source 130, the first weighting current source 140, and the second weighting current source 150. The base current source 130, the first weighting current source 140, and the second weighting current source 150 may respectively draw a base current IB, a first weighting current IW1, and a second weighting current IW2 from the second end of the voltage relaxation circuit 110, and adjust the voltage value of the output voltage VOUT through the resistor in the voltage relaxation circuit 110. The first weighting current source 140 adjusts the first weighting current IW1 according to a first bit BTB of the input data, and the second weighting current source 150 may adjust the second weighting current IW2 according to a second bit BTA of the input data. In this embodiment, the first bit BTB of the input data may be the most significant bit of the input data, and the second bit BTA of the input data may be a remaining bit.

Furthermore, the first weighting current source 140 is coupled to the output end of the amplifier AMP1 through a current load 120. The first weighting current source 140 may draw a complementary current IC from the current load 120 according to a reverse signal of the first bit BTB of the input data.

It is worth mentioning that, in this embodiment, the base current source 130 includes a variable resistor. The variable resistor may adjust the provided resistance value according to a control signal so as to adjust the current value of the base current IB. By adjusting the current value of the base current IB, the voltage value of the output voltage VOUT equal to the initial voltage generated by the digital-to-analog converter 100 corresponding to the minimum value of the input data can be adjusted. In detail, when there is an offset between the initial voltage of the output voltage VOUT and the target initial voltage, the base current source 130 may increase or decrease the voltage value of the output voltage VOUT according to the control signal so that the initial voltage of the output voltage VOUT matches the target initial voltage.

In addition, the first weighting current source 140 may adjust the first weighting current IW1 generated according to the first bit BTB of the input data. Since the first bit BTB of the input data is the most significant bit of the input data, by adjusting the current value of the first weighting current IW1, the voltage offset amount of the output voltage VOUT generated corresponding to $2^{N-1}$ steps of the digital value of the input data, based on the initial voltage, can be adjusted, where N is the total number of bits of the input data. That is to say, by adjusting the current value of the first weighting current IW1, the slope of the voltage curve of the output voltage VOUT corresponding to the digital value of the input data can be adjusted.

It is easy to see from the above that the base current IB of the base current source 130 is adjusted to align the initial voltage of the output voltage VOUT with the target initial voltage, and then the first weighting current IW1 of the first weighting current source 140 is adjusted to adjust the change slope of the output voltage VOUT and align the final voltage of the output voltage VOUT with the target final voltage. Accordingly, the output voltage VOUT of the digital-to-analog converter 100 can be accurately calibrated to ensure the accuracy of digital-to-analog conversion of the digital-to-analog converter 100.

Figure 2:
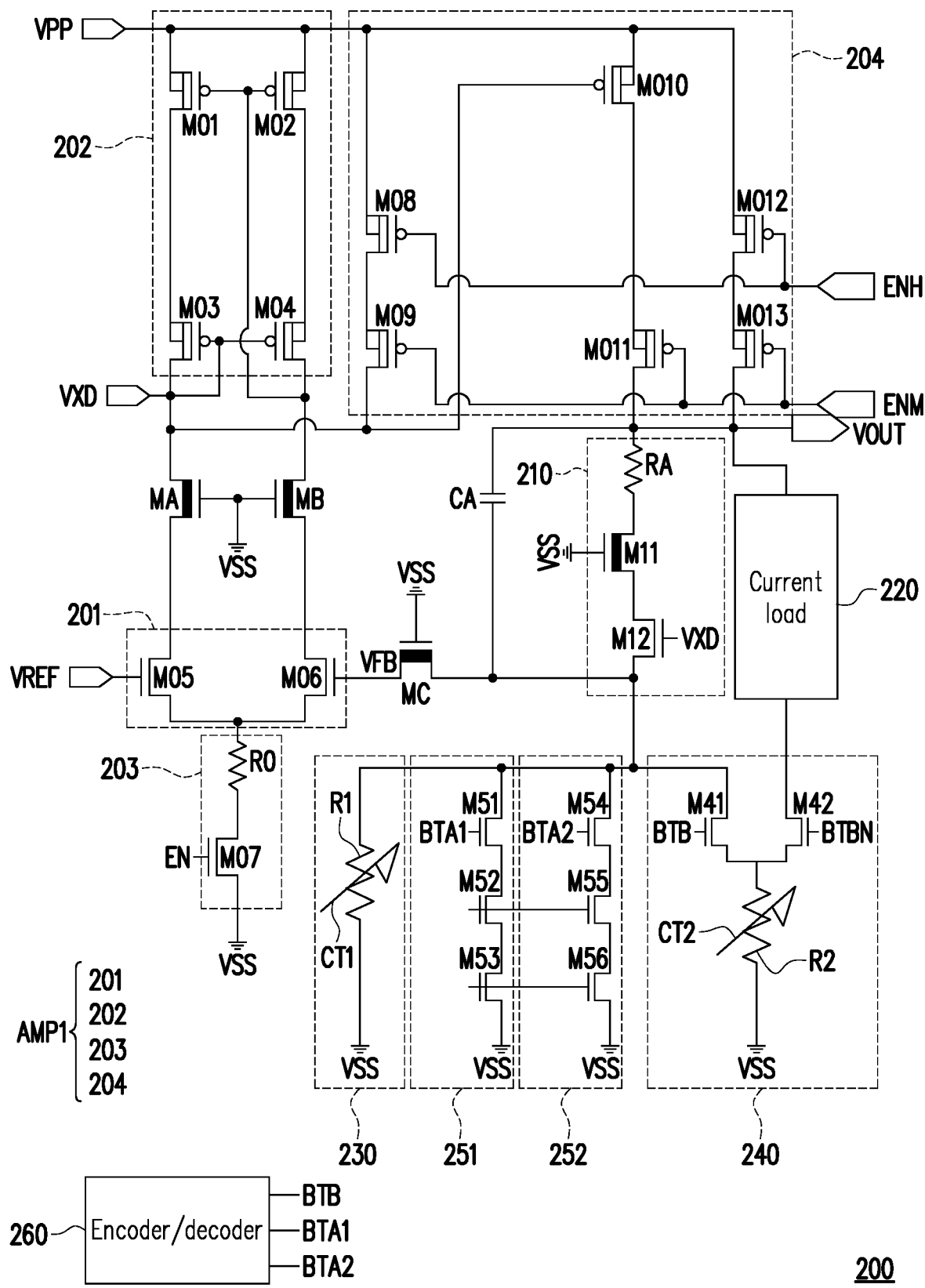
FIG. 2 is a schematic diagram of the digital-to-analog converter according to another embodiment of the disclosure.

Referring to FIG. 2, a digital-to-analog converter 200 includes an amplifier AMP1, a voltage relaxation circuit 210, a base current source 230, a first weighting current source 240, and second weighting current sources 251 and 252.

In this embodiment, the amplifier AMP1 includes a differential pair 201, an active load 202, a current source 203, and an output stage circuit 204. The differential pair 201 is constructed by transistors M05 and M06. The control ends of the transistors M05 and M06 respectively receive a reference voltage VREF and a feedback voltage VFB. The active load 202 is constructed above the differential pair 201 and coupled to the differential pair 201 through transistors MA and MB. The transistors MA and MB may be depleted transistors, and are controlled by a reference ground voltage VSS. The active load 202 is constructed by transistors M01 to M04. The transistors M01 and M02 receive a power supply voltage VPP, and the transistors M01 and M03 are connected in series; the transistors M02 and M04 are connected in series, and the control ends of the transistors M02 and M04 receive a bias voltage VXD. The current source 203 is coupled under the differential pair 201. The current source 203 includes a resistor R0 and a transistor M07 connected in series. The transistor M07 is controlled by an enable signal EN to be activated.

The output stage circuit 204 includes transistors M08 to M013. The transistors M08, M010, and M012 receive the power supply voltage VPP. The transistors M08 and M09 are coupled in series, and respectively controlled by enable signals ENH and ENM. The transistors M010 and M011 are connected in series between the power supply voltage VPP and the voltage relaxation circuit 210, the control end of the transistor M010 is coupled to the transistor MA, and the control end of the transistor M011 receives the enable signal ENM. In addition, the transistors M012 and M013 are coupled in series between the power supply voltage VPP and the current load 220, and respectively controlled by the enable signals ENH and ENM.

The voltage relaxation circuit 210 includes a resistor RA and transistors M11 and M12. The resistor RA and the transistors M11 and M12 are sequentially coupled in series between the output end of the amplifier AMP1 and the base current source 230. The transistor M11 may be a depleted transistor, and the control end thereof receives a reference ground voltage VSS. The control end of the transistor M12 receives the bias voltage VXD. In addition, the transistor M12 is coupled to an endpoint of the base current source 230, and may be coupled to the differential pair 201 through the transistor MC to provide the feedback voltage VFB. The transistor MC may be a depleted transistor, and the control end thereof receives the reference ground voltage VSS. A capacitor CA is provided between the transistor MC and the output end of the amplifier AMP1.

In this embodiment, the base current source 230 includes a variable resistor R1. The variable resistor R1 may be controlled by a control signal CT1 to adjust the provided resistance, thereby adjusting the base current generated by the base current source 230. The first weighting current source 240 includes transistors M41 and M42 and a variable resistor R2. The transistors M41 and M42 form a path selector. The path selector couples the variable resistor R2 to the current load 220 or the voltage relaxation circuit 210 according to the first bit BTB of the input data. One end of the transistor M41 is coupled to the voltage relaxation circuit 210, the other end of the transistor M41 is coupled to the variable resistor R2, and the control end of the transistor M41 receives the first bit BTB of the input data. One end of the transistor M42 is coupled to the current load 220, the other end of the transistor M42 is coupled to the variable resistor R2, and the control end of the transistor M42 receives a reverse signal BTBN of the first bit of the input data. The other end of the variable resistor R2 is coupled to the reference ground end to receive the reference ground voltage VSS.

When the transistor M41 is turned on (the transistor M42 is turned off), the first weighting current source 240 provides a first weighting current to flow through the voltage relaxation circuit 210. When the transistor M42 is turned on (the transistor M41 is turned off), the first weighting current source 240 provides a complementary current IC to flow through the current load 220.

The second weighting current source 251 includes transistors M51, M52, and M53. The transistors M51, M52, and M53 are sequentially coupled in series between the voltage relaxation circuit 210 and the reference ground voltage VSS. The control end of the transistor M51 may receive a second bit BTA1 of the input data, and the control ends of the transistors M52 and M53 may receive different bias voltages. The second weighting current source 252 includes transistors M54, M55, and M56, and the second weighting current source 252 and the second weighting current source 251 may have the same circuit structure. Moreover, the transistors M52 and M55 may receive the same bias voltage, and the transistors M53 and M56 receive the same bias voltage.

In addition, in the embodiment of the disclosure, a plurality of bits BTB, BTA1, and BTA2 of the input data may be generated by an encoder/decoder 260. The encoder/decoder 260 may generate a plurality of bits BTB, BTA1, and BTA2 of the input data through encoding/decoding operations known to those skilled in the art according to a received signal.

It is worth mentioning that the hardware structure of the amplifier AMP1 in the embodiment of the disclosure is not limited to the circuit shown in FIG. 2. In fact, the circuit structure of any amplifier known to those skilled in the art can be used to implement the amplifier AMP1 of the embodiment of the disclosure, without any particular limitation.

Figure 3A:
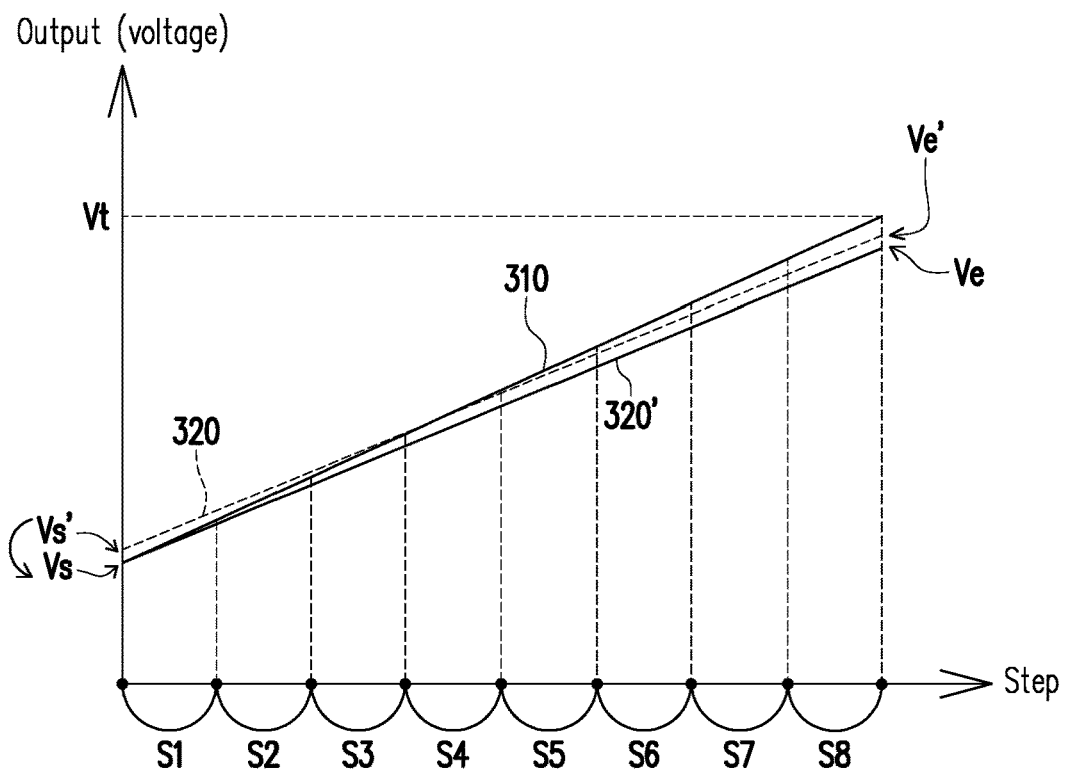
FIG. 3A to FIG. 4B are schematic diagrams illustrating the calibration operation of the output voltage of the digital-to-analog converter according to an embodiment of the disclosure.

Regarding details of a calibration operation of the output voltage VOUT of the digital-to-analog converter 200, please refer to FIG. 2 and FIG. 3A to FIG. 4B. In FIG. 3A, the input data having three bits is shown as an example. Before calibration, the curve 320 is a voltage curve of the output voltage VOUT of the digital-to-analog converter 200 corresponding to a plurality of steps S1 to S8 of the digital value of the input data. The curve 310 is a target voltage curve of the output voltage VOUT of the digital-to-analog converter 200. According to the curves 320 and 310, it can be known that the initial voltage Vs' of the output voltage VOUT of the digital-to-analog converter 200 is slightly higher than the target initial voltage Vs before calibration, and the final voltage Ve' of the output voltage VOUT corresponding to the maximum step S8 of the input data is slightly lower than the target final voltage Vt. The initial voltage Vs' is the output voltage VOUT of the digital-to-analog converter 200 corresponding to a digital value equal to 0. Thus, the digital-to-analog converter 200 may decrease the base current provided by the base current source 230 by increasing the resistance value of the variable resistor R1 in the base current source 230, thereby trimming down the initial voltage Vs' of the output voltage VOUT to be equal to the target initial voltage Vs. Through the above adjustment, the voltage curve of the output voltage VOUT of the digital-to-analog converter 200 corresponding to the multiple steps S1 to S8 of the digital value of the input data can be changed to the curve 320'.

By comparing the curves 320' and 310, it can be known that the original final voltage Ve' is trimmed down to be equal to the final voltage Ve and lower than the target final voltage Vt.

Figure 3B:
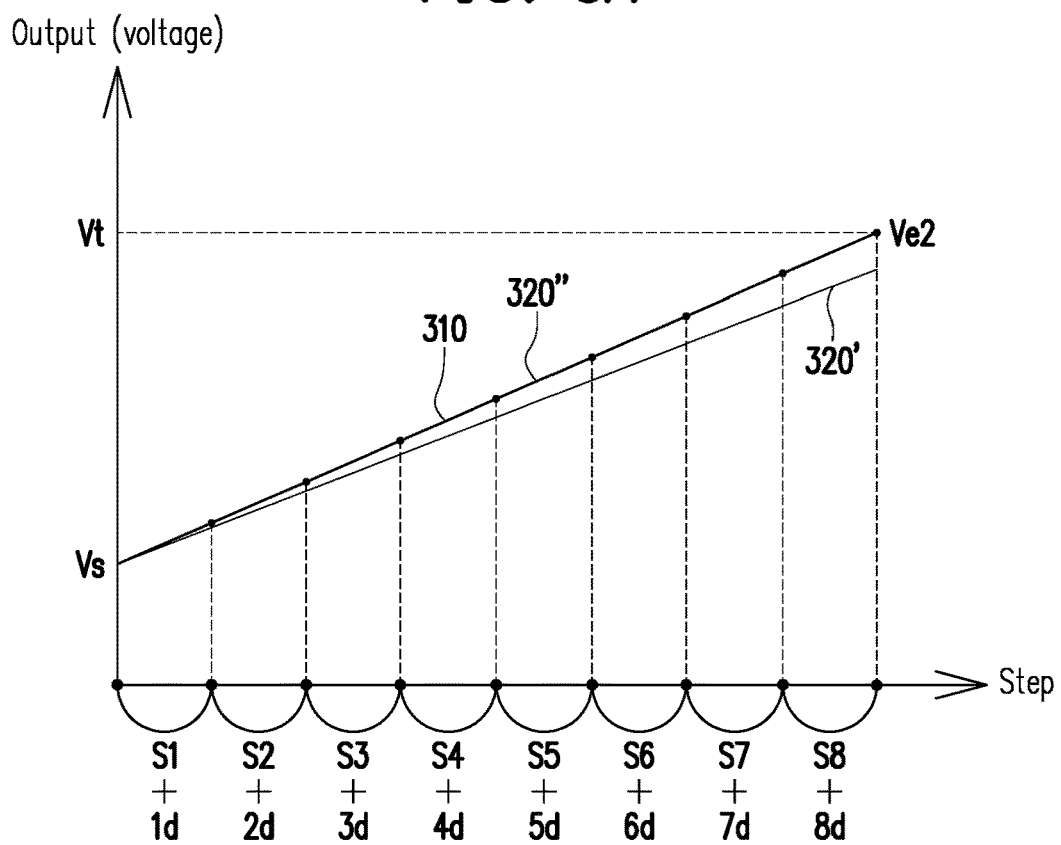

Next, referring to FIG. 3B, regarding the compensation for the difference between the target final voltage Vt and the final voltage Ve, the difference between the target final voltage Vt and the final voltage Ve is calculated, which is converted into a corresponding total current value based on the resistor RA in the voltage relaxation circuit 210, and then an offset value d can be obtained by dividing the total current value by the maximum step value (=8) of the input data. The digital-to-analog converter 200 can perform a compensation operation (trim up) of 1 to 8 times the offset value d corresponding to each of steps S1 to S8 so as to make the compensated final voltage Ve2 equal to the target final voltage Vt.

In terms of hardware operation, based on the first weighting current source 240 corresponding to the most significant bit BTB of the input data, when the input data has three bits for example, the weighting current IW1 provided by the first weighting current source 240 may correspond to four steps of the input data. For example, if the weighting current IW1 is adjusted to 1.6 microamperes, corresponding to the resistor R1 of 500 k ohms, the output voltage VOUT can be adjusted to generate a change of 0.8 volts. 0.8 volts corresponds to four step values, which means that the above adjustment can generate an offset value d of 0.2 volts.

From the above description, it can be known that the first weighting current source 240 may generate the required offset value d by adjusting the resistance value of the variable resistor R2 so as to adjust the slope of the curve 320' and obtain the adjusted curve 320". The curve 320" may overlap with the curve 310.

Accordingly, the calibration operation of the output voltage VOUT of the digital-to-analog converter 200 can be accurately completed.

It should also be noted that, in the above-mentioned calibration operation, the second weighting current sources 251 and 252 are not in operation.

Figure 4A:
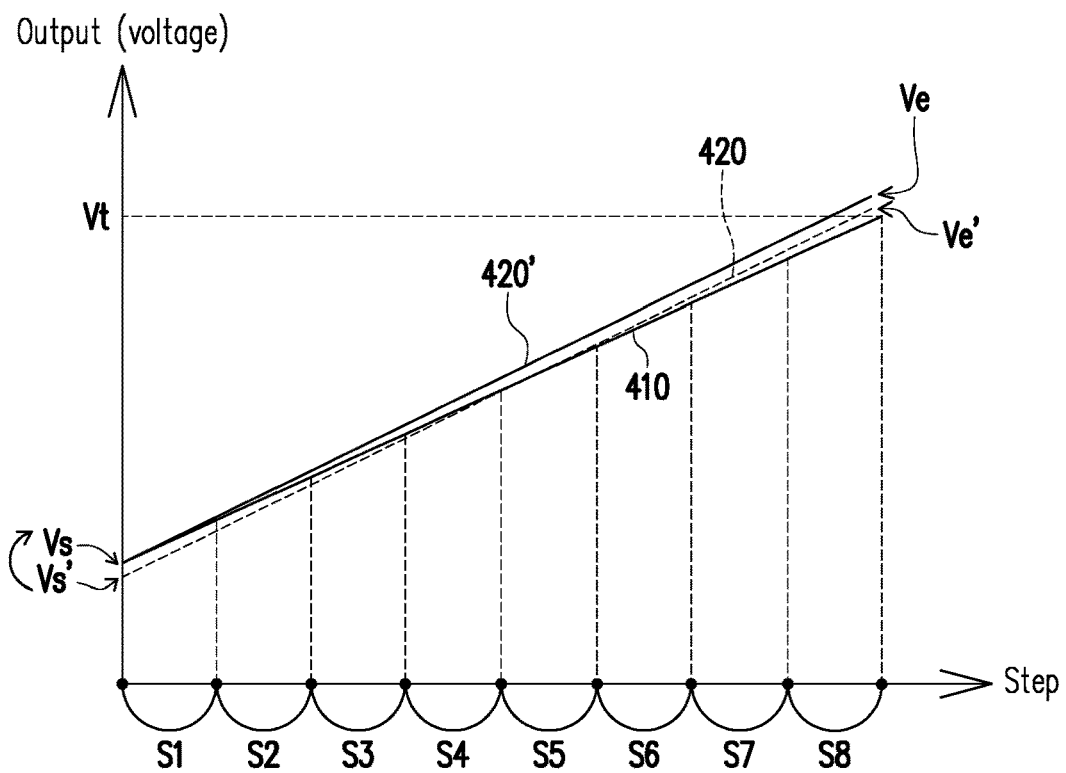

In FIG. 4A, the input data having three bits is shown as an example. Before calibration, the curve 420 is a voltage curve of the output voltage VOUT of the digital-to-analog converter 200 corresponding to a plurality of steps S1 to S8 of the digital value of the input data. The curve 410 is a target voltage curve of the output voltage VOUT of the digital-to-analog converter 200. According to the curves 420 and 410, it can be known that the initial voltage Vs' of the output voltage VOUT of the digital-to-analog converter 200 is slightly lower than the target initial voltage Vs before calibration, and the final voltage Ve' of the output voltage VOUT corresponding to the maximum step S8 of the input data is slightly higher than the target final voltage Vt. The initial voltage Vs' is the output voltage VOUT of the digital-to-analog converter 200 corresponding to a digital value equal to 0. Thus, the digital-to-analog converter 200 may decrease the base current provided by the base current source 230 by decreasing the resistance value of the variable resistor R1 in the base current source 230, thereby trimming up the initial voltage Vs' of the output voltage VOUT to be equal to the target initial voltage Vs. Through the above adjustment, the voltage curve of the output voltage VOUT of the digital-to-analog converter 200 corresponding to the multiple steps S1 to S8 of the digital value of the input data can be changed to the curve 420'.

By comparing the curves 420' and 410, it can be known that the original final voltage Ve' is trimmed up to be equal to the final voltage Ve and higher than the target final voltage Vt.

Figure 4B:
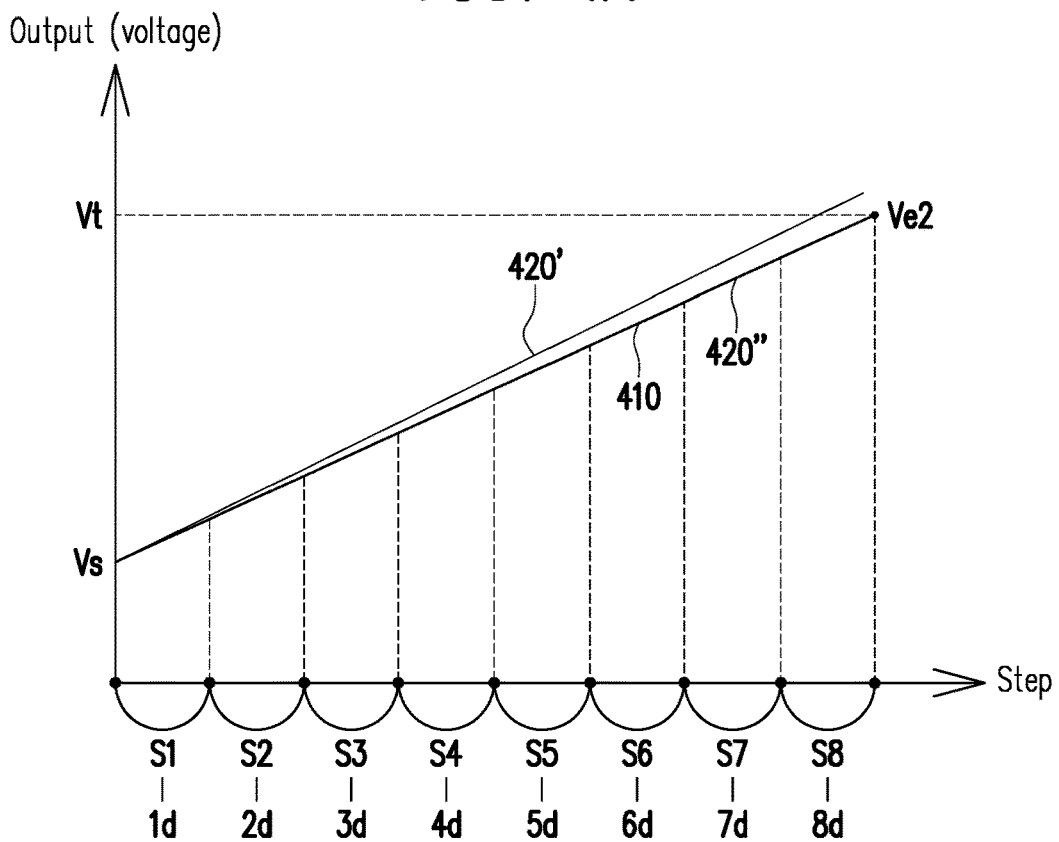

Next, referring to FIG. 4B, regarding the compensation for the difference between the target final voltage Vt and the final voltage Ve, the difference between the target final voltage Vt and the final voltage Ve is calculated, which is converted into a corresponding total current value based on the resistor RA in the voltage relaxation circuit 210, and then an offset value d can be obtained by dividing the total current value by the maximum step value (=8) of the input data. The digital-to-analog converter 200 can perform a compensation operation (trim down) of 1 to 8 times the offset value d corresponding to each of steps S1 to S8 so as to make the compensated final voltage Ve2 equal to the target final voltage Vt.

In terms of hardware operation, similarly, based on the first weighting current source 240 corresponding to the most significant bit BTB of the input data, when the input data has three bits for example, the weighting current IW1 provided by the first weighting current source 240 may correspond to four steps of the input data. For example, if the weighting current IW1 is adjusted to 1.6 microamperes, corresponding to the resistor R1 of 500 k ohms, the output voltage VOUT can be adjusted to generate a change of 0.8 volts. 0.8 volts corresponds to four step values, which means that the above adjustment can generate an offset value d of 0.2 volts.

From the above description, it can be known that the first weighting current source 240 may generate the required offset value d by adjusting the resistance value of the variable resistor R2 so as to adjust the slope of the curve 420' and obtain the adjusted curve 420". The curve 420" may overlap with the curve 410.

Accordingly, the calibration operation of the output voltage VOUT of the digital-to-analog converter 200 can be accurately completed.

It should also be noted that, in the above-mentioned calibration operation, the second weighting current sources 251 and 252 are not in operation.

In summary, the digital-to-analog converter according to the disclosure includes the base current source and the weighting current source. The base current source adjusts the initial voltage of the output voltage by adjusting the base current, and the weighting current source adjusts the slope of the curve of the output voltage corresponding to the input data by adjusting the weighting current. Thus, through the adjustments of the base current and the weighting current, the curve of the output voltage of the digital-to-analog converter can match the curve of the target output voltage, which effectively improves the accuracy of digital-to-analog conversion of the digital-to-analog converter.

What is claimed is:

1. A digital-to-analog converter, comprising:
   an amplifier receiving a reference voltage and a feedback voltage, and generating an output voltage according to the reference voltage and the feedback voltage;
   a voltage relaxation circuit coupled to an output end of the amplifier;
   a base current source coupled to the output end of the amplifier through the voltage relaxation circuit, and configured to generate a base current that is adjustable;
   a first weighting current source coupled to the output end of the amplifier through a current load and the voltage relaxation circuit, and generating a first weighting current that is adjustable between the current load or the voltage relaxation circuit and a reference ground end according to a first bit of input data; and
   at least one second weighting current source coupled to the output end of the amplifier through the voltage relaxation circuit, and generating at least one second weighting current according to at least one second bit of the input data.

2. The digital-to-analog converter according to claim 1, wherein the base current source comprises a variable resistor, and the variable resistor adjusts a resistance value provided according to a first control signal.

3. The digital-to-analog converter according to claim 1, wherein the first weighting current source comprises:
   a variable resistor configured to generate the first weighting current; and
   a path selector coupled between the variable resistor, the current load, and the voltage relaxation circuit, and coupling the variable resistor to the current load or the voltage relaxation circuit according to the first bit of the input data.

4. The digital-to-analog converter according to claim 3, wherein the path selector comprises:
   a first transistor coupled to the variable resistor and the voltage relaxation circuit, and controlled by the first bit of the input data; and
   a second transistor coupled between the variable resistor and the current load, and controlled by a reverse signal of the first bit of the input data.

5. The digital-to-analog converter according to claim 3, wherein the variable resistor receives a second control signal, and adjusts a resistance value provided according to the second control signal.

6. The digital-to-analog converter according to claim 1, wherein the base current source adjusts the base current so that an initial voltage of the output voltage is equal to a target initial voltage,
   wherein the initial voltage is equal to the output voltage generated by the digital-to-analog converter according to minimum input data.

7. The digital-to-analog converter according to claim 6, wherein the first weighting current source adjusts the first weighting current so that a final voltage of the output voltage is equal to a target final voltage,
   wherein the final voltage is equal to the output voltage generated by the digital-to-analog converter according to maximum input data.

8. The digital-to-analog converter according to claim 1, wherein the first bit is a most significant bit of the input data.

9. The digital-to-analog converter according to claim 1, wherein the voltage relaxation circuit comprises:
   a resistor having a first end coupled to the output end of the amplifier;
   a first transistor controlled by a reference ground voltage; and
   a second transistor coupled in series with the first transistor between the resistor and the base current source, and controlled by a bias voltage to generate the feedback voltage at an endpoint coupled to the base current source.

10. The digital-to-analog converter according to claim 1, wherein the amplifier comprises:
    a differential pair receiving the reference voltage and the feedback voltage;
    an active load coupled to the differential pair;
    a current source coupled to the differential pair; and
    an output stage circuit coupled to a differential output end of the differential pair, and generating the output voltage according to the base current, the first weighting current, and the at least one second weighting current.

11. The digital-to-analog converter according to claim 1, further comprising:
    an encoder/decoder configured to provide the first bit and the at least one second bit of the input data.

12. The digital-to-analog converter according to claim 1, wherein the at least one second weighting current source comprises:
    a first transistor coupled to the voltage relaxation circuit, and controlled by each of the at least one second bit of the input data; and
    at least one second transistor coupled in series with the first transistor between the voltage relaxation circuit and a reference ground end, and controlled by at least one bias voltage.

13. The digital-to-analog converter according to claim 1, wherein the first weighting current source comprises a plurality of first sub-weighting current sources, and the first sub-weighting current sources are jointly coupled to the voltage relaxation circuit and the current load and jointly generate the first weighting current.

14. The digital-to-analog converter according to claim 13, wherein the first sub-weighting current sources have the same circuit structure.

15. The digital-to-analog converter according to claim 13, wherein a first sub-weighting current generated by each of the first sub-weighting current sources is $2^N$ times each of the at least one second weighting current, where N is a positive integer.

* * * * *